United States Patent [19]
Phillips et al.

[11] Patent Number: 5,939,189
[45] Date of Patent: *Aug. 17, 1999

[54] FLEXIBLE PLASTIC SUBSTRATE WITH ANTI-REFLECTION COATING HAVING LOW REFLECTIVE COLOR AND METHOD

[75] Inventors: Roger W. Phillips, Santa Rosa; Charlotte R. LeGalle, Healdsburg, both of Calif.

[73] Assignee: Flex Products, Inc., Santa Rosa, Calif.

[*] Notice: This patent issued on a continued prosecution application filed under 37 CFR 1.53(d), and is subject to the twenty year patent term provisions of 35 U.S.C. 154(a)(2).

[21] Appl. No.: 08/438,197

[22] Filed: May 9, 1995

[51] Int. Cl.$^6$ .................................................. B32B 17/00
[52] U.S. Cl. .......................... 428/336; 428/347; 428/352; 428/356; 428/480; 428/696; 428/699; 428/701; 428/702; 359/359; 359/361; 359/586; 359/589
[58] Field of Search ...................................... 359/359, 361, 359/586, 589; 428/336, 480, 347, 352, 356, 696, 699, 701, 702

[56] References Cited

U.S. PATENT DOCUMENTS

| | | | |
|---|---|---|---|
| 3,356,522 | 12/1967 | Libbert | 428/412 |
| 4,333,983 | 6/1982 | Allen | 428/336 |
| 4,702,963 | 10/1987 | Phillips | 428/34.7 |
| 5,168,003 | 12/1992 | Proscia | 428/701 |
| 5,248,545 | 9/1993 | Proscia | 428/701 |

FOREIGN PATENT DOCUMENTS

| | | | |
|---|---|---|---|
| 212704 | 10/1985 | Japan | 359/586 |
| 2191801 | 8/1987 | Japan | 359/586 |
| 2181701 | 7/1990 | Japan | 359/586 |

Primary Examiner—Timothy M. Speer
Attorney, Agent, or Firm—Workman, Nydegger & Seeley

[57] ABSTRACT

An optical article comprising a flexible plastic substrate having an index of refraction ranging from 1.55 to 1.71 and having first and second surfaces and an anti-reflection coating carried by the first surface. The anti-reflection coating consists of a high index material and a low index material in which the high index material has an index of refraction of 2.0 and greater to provide the index of refraction difference between the substrate and the high index material of 0.29 to 0.75. The low index material is formed of a material having an index of refraction of 1.38 or less to provide an index of refraction difference between the high index material to the low index material ranging from approximately 0.59 to 0.92.

19 Claims, 4 Drawing Sheets

FLEXIBLE PLASTIC SUBSTRATE WITH ANTI-REFLECTION COATING HAVING LOW REFLECTIVE COLOR AND METHOD

This invention relates to a flexible plastic substrate with anti-reflection coating having low reflective color and method and more particularly to the flexible hard-coated polymeric web with a two-layer anti-reflection coating having low reflective color at angle and method.

Heretofore two layer anti-reflection coatings have been provided on glass. Also, anti-reflection coatings have been provided on plastic. For example, Optical Coating Laboratory Inc. of Santa Rosa, Calif., has produced a product under the trademark HEA 2000 which is a wide-band multilayer anti-reflection coating on hardcoated PET or similar plastic substrate. The coated surface can be either textured or smooth. The uncoated surface had a pressure sensitive adhesive protected by a release liner. The product utilized an anti-reflection coating comprised of four layers consisting of silicon dioxide and titanium dioxide with high-low pairs on the coated surface.

Allen U.S. Pat. No. 4,333,933 discloses a two layer coating (one adhesive layer, one anti-reflective layer) on polyester to reduce the reflective transmittance from approximately 6% down to approximately 1% at the designed wavelength. At other wavelengths, the reflection is greater than 1% and is between 1–3% throughout the major portion of the visible spectrum. This optical performance is clearly shown in FIG. 7 of Allen. FIG. 7 is a graph of the spectral performance of the article depicted in FIG. 6 of Allen in which polyester had been coated with 170 nanometers of aluminum oxide on both sides of the polyester followed by a quarter wave of $MgF_2$ on top of each of the surfaces of the aluminum oxide. In other words, this design consists of a half wave of aluminum oxide at approximately 560 nanometers followed by a quarter wave of $MgF_2$ at 560 nanometers. Allen indicates that the "Currently preferred method of forming the optical coatings on a flexible polymer substrate in a roll coating apparatus", such as that depicted in FIG. 10 or other types mentioned above, is shown in FIG. 11 (col. 9:59). This design has been modeled on PET (polyethylene terephthalate) and is shown in Applicants' FIG. 5 as curve 91 (one sided PET coated). Although the Allen patent discussed a three-layer system (a half-wave of aluminum oxide adhesive layer followed by a two-layer anti-reflection coating), this design involves a mixture of aluminum oxide and another material having an index of refraction of about 2.1 (col. 8:47-50). There are two difficulties with this design. First, a mixture of aluminum oxide and a material having an index of a refraction of about 2.1 mixed together to form an index of 1.89 is generally not commercially available and suffers from the possibility of fractionation during evaporation. Secondly, the use of three materials in a vacuum roll coater is impractical. Allen points that "in large scale roll coater for depositing more complex optical coatings using more layers of different materials", three or more deposition sources, each associated with a separate chill drum, could be employed (col. 9:54-48). Because this is commercially impractical, Allen prefers the method of forming the optical coatings as described in Column 9:59-68 and Column 10:1-30, for depositing a two layer system, i.e., a half wave of aluminum oxide followed by a quarter wave of $MgF_2$.

Both the HEA 2000 and the Allen designs have additional layers which necessitate, in the case of Allen, multiple sources for the three different materials and in the case of a four-layer HEA 2000, additional passes in a roll coater.

There is a need for a new and improved reflection coating which can be utilized on the flexible plastic substrate to provide low reflective color at angle at low cost.

In general, it is an object of the present invention to provide a flexible plastic substrate with or without a hardcoat with an anti-reflection coating using only two materials having greatly improved anti-reflection properties with low reflective color and a method which is particularly adapted for economical production in commercial roll coaters.

Another object of the invention is to provide a product and method of the above-character in which only two layers are needed for forming the anti-reflection coating.

Another object of the invention is to provide a product and method of the above-character in which the product can be produced by either a single pass or two passes through a roll-coating machine.

Another object of the invention is to provide a product of the above-character which has excellent durability characteristics.

Another object of the invention is to provide a product of the above-character in which a hardcoat is provided on the plastic substrate to confer unexpected durability to the anti-reflection coating.

Another object of the invention is to provide a product of the above-character which has very low reflectance in the visible wavelength region.

Additional objects and features of the invention will appear from the following description which the preferred embodiments are set forth in detail in conjunction with the accompanying drawings.

In general, an article made in accordance with the present invention consists of a flexible plastic substrate having first and second surfaces. A two-layer anti-reflection coating consisting of a half wave layer of high index oxide having an index of refraction of $n \geq 2.0$ and a quarter wave layer of magnesium fluoride is provided on one of the surfaces to provide an anti-reflection coating having low-reflective color. To provide durability, a hardcoat can be provided on a surface prior to the deposition of the anti-reflection coating thereon.

More in particular, optical article 21 consists of a flexible plastic substrate 22 having a suitable thickness, as for example 1–10 mils and preferably a thickness ranging from 3–5 mils. The plastic substrate can have an index of refraction ranging from 1.65 to 1.71 and should be clear in the visible region from 400–700 nanometers. The substrate 22 is provided with first and second generally parallel surfaces 23 and 24. The plastic substrate 22 typically is formed of a polymer such as polyethylene terephthalate having an index of a refraction of approximately 1.67. Other materials can be utilized which have the desired characteristics, as for example PEN which is a polyethylene naphthalate having an index of refraction of 1.55. However, some loss in optical performance will occur using this lower refractive index substrate. The plastic for the substrate should be flexible, clear and relatively tough.

Figure 1:
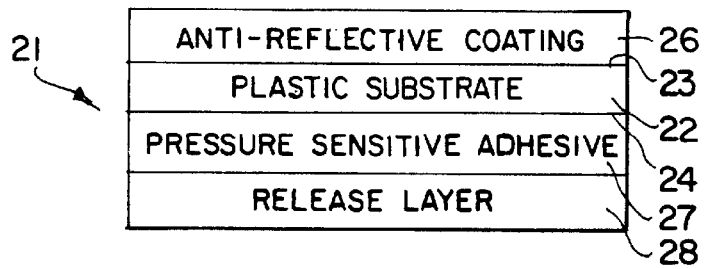
FIG. 1 is a cross-sectional view of an article incorporating the present invention in the form of a flexible plastic substrate with an anti-reflection coating having low reflective color.

An anti-reflection coating 26 is provided on one of the surfaces 23 and 24 and as shown in FIG. 1 as provided on the surface 23. The anti-reflection coating 26 in accordance with the present invention is comprised of a half wave at a design wavelength of 550 nanometers of zirconium oxide and a quarterwave at the same design wavelength of magnesium fluoride. As hereinafter described, the zirconium oxide and the magnesium fluoride can be deposited in a vacuum chamber of a roll coater. The zirconium oxide is a material which has a high index of refraction of 2.0 or greater and provides a delta between the plastic substrate and the zirconium oxide ranging from 0.29 to 0.75. Alternatively, a mixed oxide high index coating material described in co-pending application Ser. No. 08/438/198 filed May 9, 1995 (A-59648/HCH) can be utilized. It has an index refraction of 2.0 or greater. The magnesium fluoride is a low index material and should be a material which has an index of 1.38 or less to provide a delta between the high index material and the low index material of 0.59 to 0.92 and preferably approximately 0.62.

A pressure sensitive adhesive 27 is provided on the surface 24 of the plastic substrate 22 and has a release liner 28 adherent thereto which can be in the form of plastic or paper.

In connection with the present invention, the anti-reflection coating 26 can be characterized as a soft coating to provide an article which could be utilized for manufacturing products having a one-time use or a relatively short-life use, as for example material for face masks for surgeons and dentists and the like.

Figure 2:
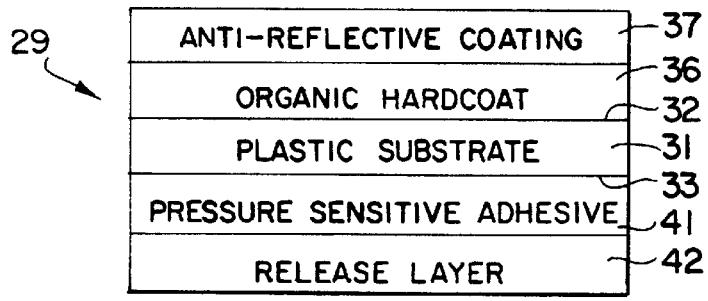
FIG. 2 is another embodiment of the article shown in FIG. 1 utilizing an organic hardcoat.

When it is desired to provide a more durable anti-reflective coating, a construction such as shown in FIG. 2 can be utilized in which a plastic substrate 31 similar to the plastic substrate 22 is provided and which has first and second surfaces 32 and 33. A hardcoat 36 is provided on the surface 32 and is in the form of a organic hardcoat such as an acrylic polymer. The hardcoat is applied to a suitable thickness, as for example ranging from 1–25 microns and preferably a thickness of approximately 1–5 microns. However, it should be appreciated that if desired other materials can be utilized a UV-cured epoxy, such as MAR-NOT XL manufactured by Tekra of 16700 West Lincoln Avenue, St. Albins, Vt. The hardcoat is applied outside of a vacuum chamber and can be applied in a suitable manner such as by a gravure coater in a wet chemical method. The hardcoat material is applied at room temperature and allowed to dry outside the vacuum chamber. An anti-reflective coating 37 is then deposited in the same manner as the anti-reflective coating 26 shown in FIG. 1 on the organic hardcoat 32 after it has dried. It has the design of a half wave of zirconium oxide and a quarter wave of magnesium fluoride at the design wavelength.

A greatly improved anti-reflective coating 37 is provided with respect to the plastic substrate 31 over that of glass which has been emphasized in the prior art because the plastic substrate has an index of refraction of between 1.65 and 1.71 whereas glass has an index of refraction of approximately 1.45. The organic hardcoat 32 provided below the anti-reflective coating 37 provides greatly increased durability as hereinafter described.

A pressure-sensitive adhesive 41 is provided on the surface 33 which is covered with a release layer 42 similar to the manner in which the pressure-sensitive adhesive 27 and the release layer 28 described in FIG. 1 were applied.

Figure 3:
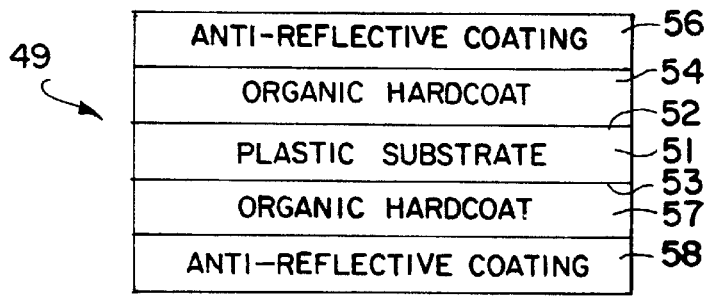
FIG. 3 is a cross-sectional view of an article similar to FIG. 2 with the exception that an anti-reflective coating is provided on both sides of the plastic substrate.

Still another article incorporating the present invention is shown in cross section in FIG. 3 in which a plastic substrate 51 of the type hereinbefore described is provided having first and second surfaces 52 and 53. An organic hardcoat 54 is provided on the surface 52 followed by a two-layer anti-reflective coating 56 of the type hereinbefore described. An organic hardcoat 57 similar to the organic hardcoat 54 is provided on the surface 53 and has provided thereon a two-layer anti-reflective coating 58 similar to the anti-reflective coating 56. Thus, it can be seen in connection with the embodiment shown in FIG. 3 an organic hardcoat has been provided on both of the surfaces of the plastic substrate which have been covered by an anti-reflective coating.

Figure 4:
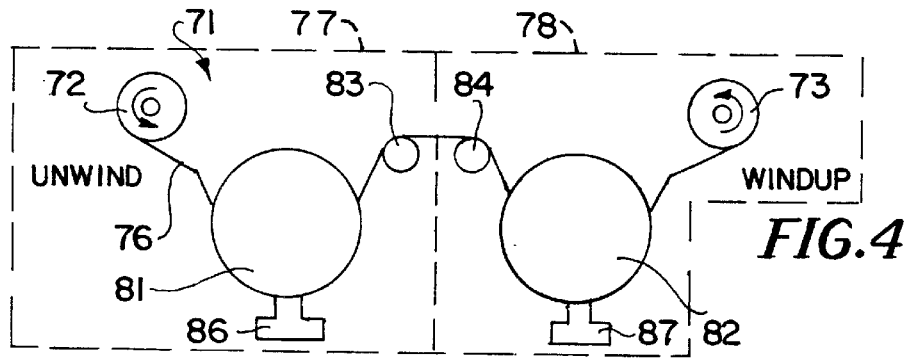
FIG. 4 is a side-elevational schematic illustration of a roll coater utilized in making the articles or products shown in FIGS. 1, 2 and 3.

The relatively simple constructions of the article shown in FIGS. 1, 2 and 3 particularly lend themselves to low-cost manufacture in roll-coating machines of a conventional type. Such a conventional roll-coating machine 71 is shown schematically in FIG. 4. In connection with such a roll coater, the plastic substrate 22, 31 and 51 before they are supplied to the roll coater 71 can have an organic hardcoat of the type hereinbefore described applied to one surface of the plastic substrate and can have the pressure-sensitive adhesive with the release liner applied to another surface of the substrate. Such a coated plastic substrate can be prepared outside of the vacuum chamber for the roll coater, the coated plastic substrate can be rolled onto an unwind reel 72 as shown in FIG. 3 and taken up on a windup reel 73 to provide a web 76. The plastic substrate or web 76 as it is unwound from the unwind reel 72 can be advanced in first and second vacuum chambers 77 and 78 or alternatively in a single vacuum chamber where that is desirable with a first drum 81 being disposed in the first vacuum chamber 77 and a second drum 82 being disposed in the second vacuum chamber 78 with the web or film 76 passing under the drums 81 and 82 as shown in FIG. 4 and passing over idler rollers 83 and 84. Suitable sources 86 and 87 are provided in the chambers 77 and 78. Thus, by way of example source 86 can be an electron beam evaporation source for evaporating zirconium oxide and the source 87 can be a resistive evaporation source for evaporating magnesium fluoride. Alternatively, an electron beam evaporation source can be used for evaporating the magnesium fluoride. Thus, it can be seen in accordance with the present invention, the two-layer anti-reflection coating comprised of the zirconium oxide and the magnesium fluoride can be applied in the roll coater in a single pass of the substrate 76 through the roll coater without breaking vacuum. It should be appreciated in accordance with the present invention that if desired, the anti-reflection coating can be applied directly to the substrate as shown in FIG. 1 in a single pass through the roll coater and thereafter if desired the pressure-sensitive adhesive and the release layer can be applied outside the vacuum of the roll coater 71.

If it is desired to provide an anti-reflective coating on both sides of the substrate, the organic hardcoat can be provided on both sides of the substrate and thereafter, the web can be passed through the roll coater in the first past to provide the anti-reflective coating on one organic hardcoat and thereafter by making in the second pass the anti-reflective coating can be provided on the other hardcoat layer.

The rather remarkable properties which can be achieved from the optical article made in accordance with the present invention are illustrated in FIGS. 5–11. In the graph shown in FIG. 5 the optical performance of three different products are shown in the curves 91, 92 and 93 which show the theoretical optical performance from 350–850 nanometers and particularly from 400–700 nanometers which is the principal area of interest. The curve 91 represents the product made in accordance with the Allen U.S. Pat., 4,333,983 hereinbefore described. Curve 92 represents a four-layer product identified as HEA 2000™ manufactured by Optical Coating Laboratory Inc. Curve 93 represents a product made in accordance with the present invention. The curve 91 represents a product which was made with a PET substrate with an aluminum oxide glue layer of 170 nanometers in thickness followed by a one-half wavelength layer of a dielectric material of a mixture having an index of refraction of 1.89 and a one-quarter wavelength of magnesium fluoride at a design wavelength of 550 nanometers. The HEA 2000™ article had a PET substrate followed by hardcoat on one surface upon which there was deposited one-eighth wavelength of titanium dioxide, a one-eighth wavelength of silicon dioxide, one-half wavelength of titanium dioxide and a one-quarter wavelength of silicon dioxide at a design wavelength of 550 nanometers.

The product represented by the theoretical curve 93 of the present invention utilized PET as a substrate and had 2 microns of a hardcoat deposited on the surface followed by a one-half wavelength of zirconium oxide followed by a one-quarter wavelength of magnesium fluoride both at design wavelengths of 550 nanometers. From FIG. 5 it can be seen that the specular reflectance provided by the curve 93 of the article incorporated in the present invention is markedly superior to the performance which can be obtained from the other two articles represented by curves 91 and 92 in that it provides a much broader band with reduced reflectance over the entire band substantially below 1%. The curve 91, on the other hand, is substantially v-shaped and rises very rapidly in reflectance above 550 nanometers. The curve 92 also rises relatively rapidly after 620 nanometers. On the other hand, the curve 93 for the article of the present invention is substantially below 1% from a region from approximately 420 nanometers to excess of 700 nanometers.

Thus, it can be seen in connection with the present invention, applicant has achieved remarkable results from utilizing only two materials which can be evaporated from two sources in a single pass through a roll coater whereas prior art articles of Allen and the HEA 2000™ are substantially more complicated in requiring more materials and more layers and therefore more processing steps in vacuum chambers to achieve inferior anti-reflective properties.

Figure 6:
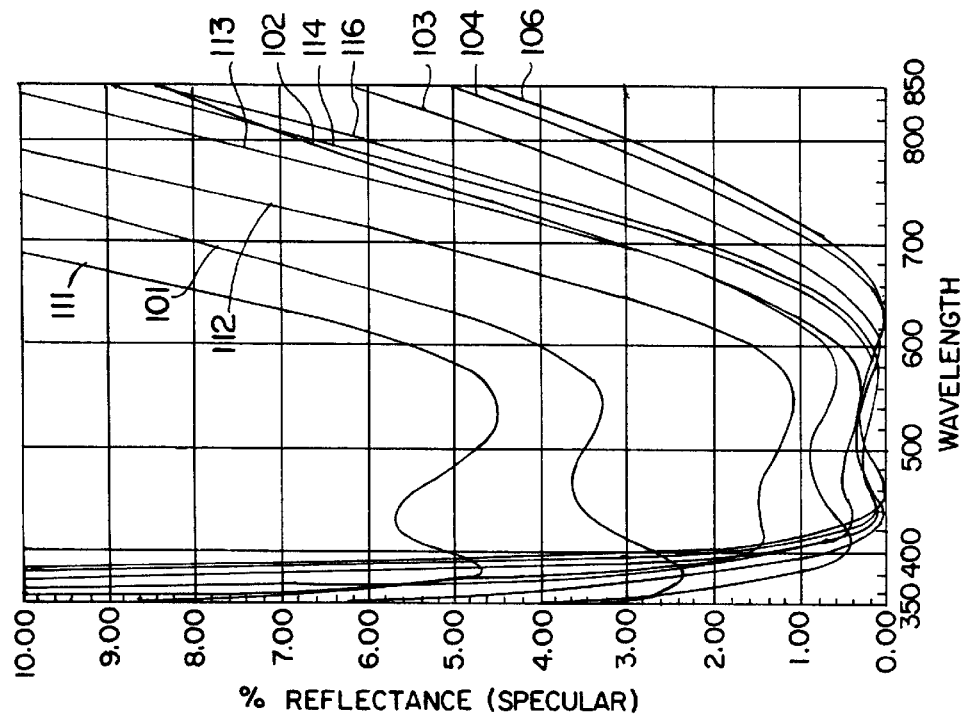
FIG. 6 is a graph showing the optical performance of the article of the present invention and the prior art products at angle.
Figure 5:
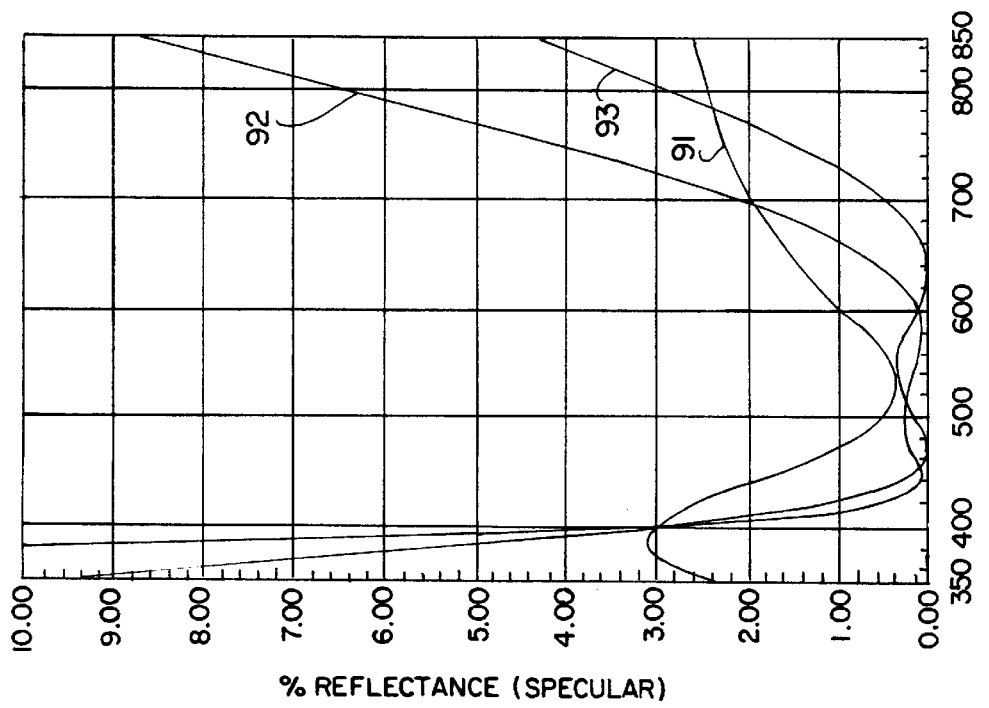
FIG. 5 is a graph showing the optical performance of prior art articles compared to an article made in accordance with the present invention.

In FIG. 6, there is shown the theoretical optical performance with respect to the specular reflectance of the present invention in comparison to the HEA 2000™ product at angle. The curves 101 and 102, 103, 104 and 106 represent the reflectance at 60°, 45°, 30°, 15° and 0°, respectively whereas the curves 111, 112, 113, 114 and 116 represent the reflectance for the HEA 2000™ at 60°, 45°, 30°, 15°, 0°, respectively. From these curves it can be seen that the theoretical curves of reflected color at angle for the product of the present invention is much better than that of the HEA 2000™. The HEA 2000™ at angle has a reflected color that looks slightly magenta whereas the color of the product of the present invention has less color since the reflectivity at the higher wavelengths, as for example 700 nanometers and greater is less by a considerable degree. Therefore, the anti-reflection coating of the present invention provides low color at high angle.

Figure 7:
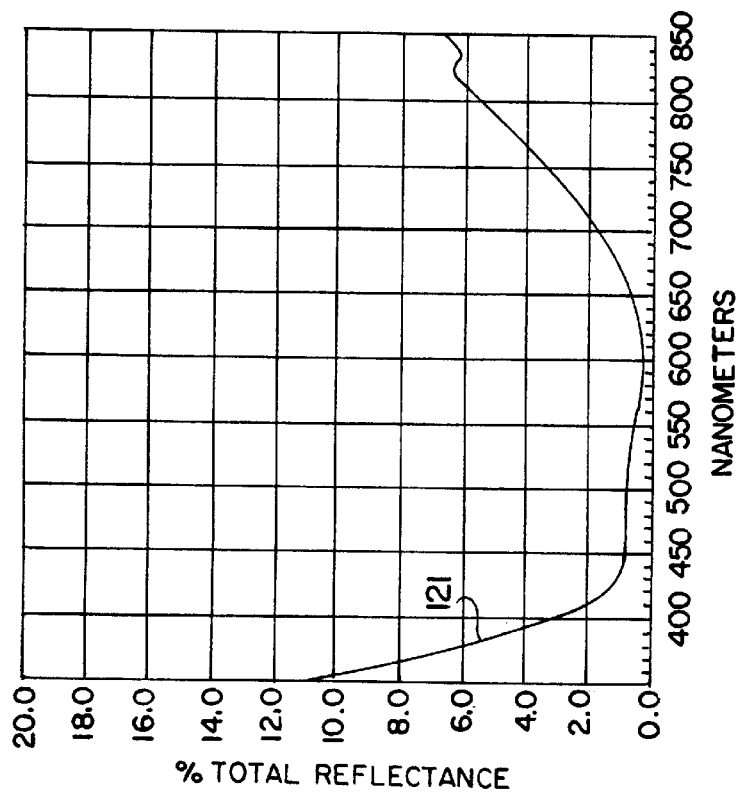
FIG. 7 is a graph showing the actual optical performance of a product made in accordance with the present invention.

FIG. 7 shows the actual optical performance of a product made in accordance with the present invention in which the substrate is formed of PET coated with a matt hardcoat followed by the anti-reflection coating. The curve 121 shows the combined specular and diffused reflectance i.e., total reflectance and shows that the reflectance is less than approximately 1% in the visible region ranging from approximately 425–675 nanometers. In making the measurements shown, the back surface of the substrate was painted black to minimize any reflection from the back surface.

Figure 8:
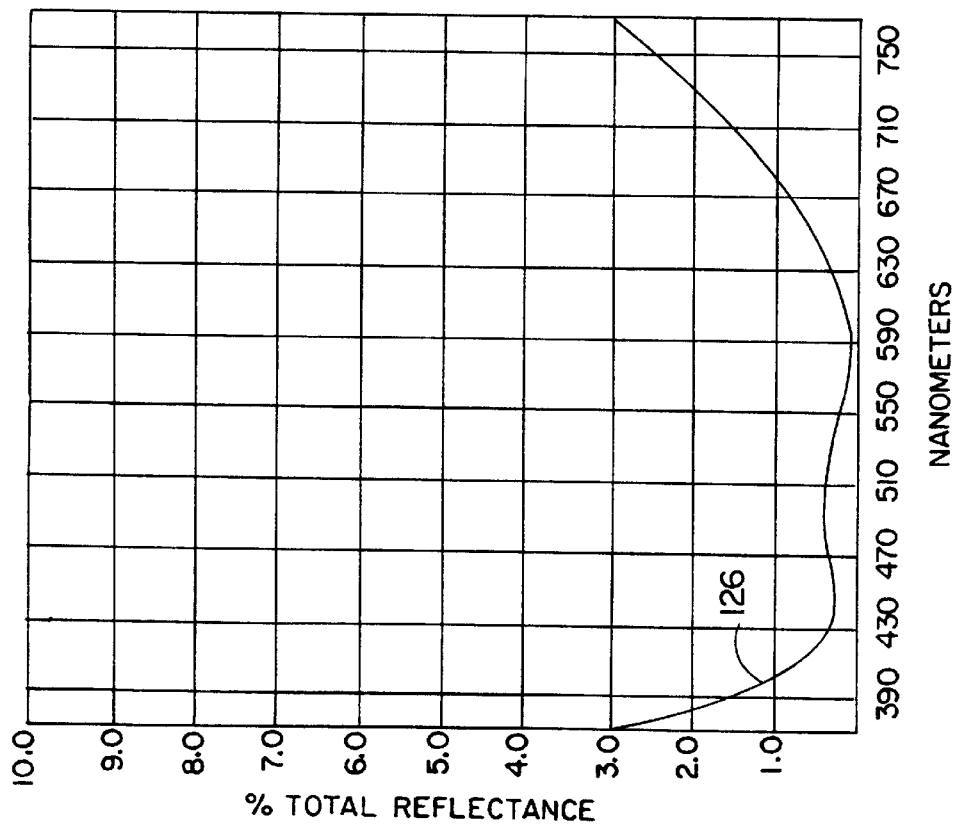
FIG. 8 is another graph showing the actual optical performance of a product made in accordance with the present invention.

In FIG. 8, curve 126 shows the optical performance obtained utilizing a PET substrate with an anti-reflection coating incorporating the present invention provided on both sides of the substrate without a hard coat on either side of the substrate. Again, it can be seen that excellent anti-reflection properties are obtained in the 400–700 nanometer region to provide a specular reflectance which is less than one-half percent and typically at about 0.3% throughout the region of interest. It again establishes that an anti-reflection coating made in accordance with the present invention on a plastic substrate has a wider band and is less sensitive to a reflected color at angle than the HEA 2000™.

Figure 9:
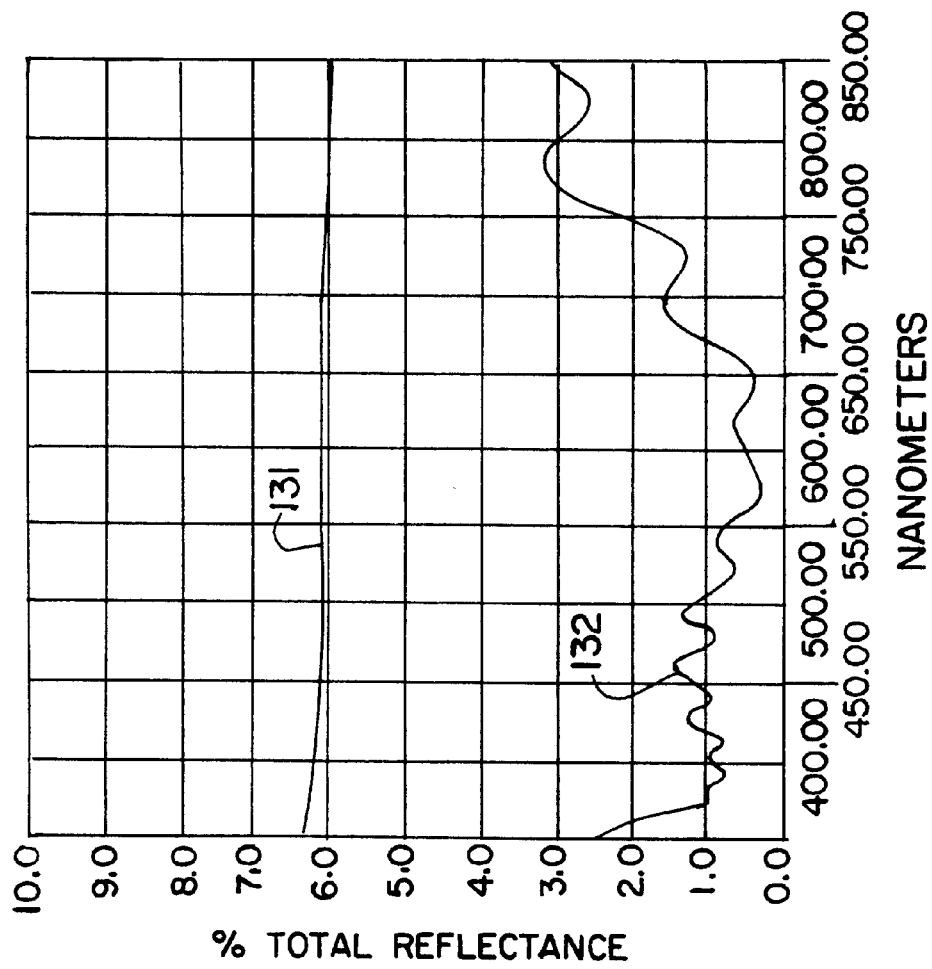
FIG. 9 is another graph showing the optical performance of a article made in accordance with the present invention.

In FIG. 9, two curves 131 and 132 are shown in which curve 131 represents the optical performance of a PET substrate by itself and curve 132 represents an article made in accordance with the present invention with a PET substrate with an anti-reflection coating deposited over a clear hardcoat on the PET substrate. From these curves it can be seen that the reflectance extends from below 400 nanometers to approximately 675 nanometers and that the two-layer anti-reflection coating reduces the integrated reflectance from approximately 6% to 0.75% actual integrated reflectance. In both the coated and uncoated PET substrate, the back surface was painted black to minimize the reflections from that side.

In addition to the low reflectivity and excellent color characteristics hereinbefore described for the article, it has been found that the article when it is provided with a hardcoat underlying the anti-reflection coating had excellent durability. For example, it was able to withstand 20 rubs with a 000 steel wool material and after a humidity test 10–20 rubs with the same steel wool material. It also could withstand over 2000 cheesecloth rubs. This was at least as good as could be obtained from prior art articles, as for example the article made in accordance with the Allen patent or the HEA 2000™.

From the foregoing, it can be seen that an optical article or product made utilizing the product of the present invention can have many applications. For example, as explained previously if the product in which it is to be is to be used only one time or only several times, the product can have an anti-reflection coating without a hardcoat below the same. Where increased durability is desired, this can be readily obtained by utilizing a hardcoat on the surface of the substrate prior to depositing the anti-reflection coating thereon. The product is wide band with low overall visible reflectance and is less sensitive to reflected color at angle.

What is claimed is:

1. An optical article comprising a flexible plastic substrate having an index of refraction ranging from about 1.55 to about 1.71 and having first and second surfaces, and a two-layer anti-reflection coating carried by said first surface, said anti-reflection coating including a first layer of high index material with an index of refraction of about 2.0 or greater on the first surface of the substrate, the first layer having an optical thickness of one-half wavelength in the visible wavelength region, and a second layer of low index material with an index of refraction of about 1.38 or less on the first layer, the second layer having an optical thickness of one-quarter wavelength in the visible wavelength region, wherein the anti-reflection coating provides a reflectance less than about 1% substantially throughout the visible wavelength region.

2. An article as in claim 1 wherein said layer of high index material is zirconium oxide and said layer of low index material is magnesium fluoride.

3. An article as in claim 1 further comprising an organic hardcoat deposited on the first surface of the substrate and being interposed between the anti-reflection coating and the first surface of the substrate.

4. An article as in claim 3 wherein said hardcoat has a thickness ranging from about 1–25 microns.

5. An article as in claim 4 wherein said hardcoat has a thickness of approximately 2 microns.

6. An article as in claim 3 wherein said anti-reflection coating can withstand 20 rubs of 000 steel wool.

7. An article as in claim 3 wherein said anti-reflection coating can withstand over 2000 cheesecloth rubs.

8. An article as in claim 1 wherein said substrate comprises a material selected from the group consisting of polyethylene terephthalate (PET) and polyethylene naphthalate (PEN).

9. An article as in claim 1 together with a pressure-sensitive adhesive carried by said second surface of the substrate and a release layer secured to the pressure-sensitive adhesive.

10. An article as in claim 1 together with an organic hardcoat formed on the second surface of the substrate and an anti-reflection coating disposed on the organic hardcoat on the second surface.

11. An article as in claim 1 wherein the reflectance provided by the anti-reflection coating is approximately one-half percent from the region of about 400–700 nanometers on average.

12. An article as in claim 1 wherein said anti-reflection coating provides low color at high angle.

13. An article as in claim 1 in which there is an index of refraction difference between the high index material and the low index material ranging from approximately 0.59 to 0.92.

14. An article as in claim 1 wherein said anti-reflection coating includes a hardcoat and provides a reflectance of less than about 1% in the range from about 420 nanometers to about 700 nanometers.

15. An optical article comprising:

a flexible plastic substrate;

an organic hardcoat layer on a surface of said plastic substrate; and a two-layer anti-reflection coating on said organic hardcoat layer, said anti-reflection coating including a first layer of zirconium oxide on said organic hardcoat layer, the first layer having an optical thickness of one-half wavelength in the visible wavelength region, and a second layer of magnesium fluoride on the first layer, the second layer having an optical thickness of one-quarter wavelength in the visible wavelength region;

wherein said anti-reflection coating provides a reflectance to the optical article of less than about 1% in the visible wavelength region from about 420 nm to about 700 nm.

16. An article as in claim 15 wherein said plastic substrate has an index of refraction ranging from about 1.55 to about 1.71.

17. An article as in claim 15 wherein said plastic substrate comprises a material selected from the group consisting of polyethylene terephthalate, and polyethylene naphthalate.

18. An article as in claim 15 wherein said organic hardcoat layer has a thickness ranging from about 1–25 microns.

19. An optical article comprising:

a flexible plastic substrate having a first surface and an opposing second surface;

a first organic hardcoat layer on the first surface of said substrate;

a first two-layer anti-reflection coating on said first organic hardcoat layer, said first two-layer anti-reflection coating including a layer of zirconium oxide on the first organic hardcoat layer, the layer of zirconium oxide having an optical thickness of one-half wavelength in the visible wavelength region, and a layer of magnesium fluoride on the layer of zirconium oxide, the layer of magnesium fluoride having an optical thickness of one-quarter wavelength in the visible wavelength region;

a second organic hardcoat layer on the second surface of said substrate; and a second two-layer anti-reflection coating on said second organic hardcoat layer, said second two-layer anti-reflection coating including a layer of zirconium oxide on the second organic hardcoat layer, the layer of zirconium oxide having an optical thickness of one-half wavelength in the visible wavelength region, and a layer of magnesium fluoride on the layer of zirconium oxide, the layer of magnesium fluoride having an optical thickness of one-quarter wavelength in the visible wavelength region;

wherein the first and second anti-reflection coatings provide a reflectance to the optical article of less than about 1% substantially throughout the visible wavelength region.

* * * * *

UNITED STATES PATENT AND TRADEMARK OFFICE
CERTIFICATE OF CORRECTION

PATENT NO. : 5,939,189
DATED : August 17, 1999
INVENTOR(S) : Roger W. Phillips; Charlotte R. LeGalle It is certified that error appears in the above-identified patent and that said Letters Patent is hereby corrected as shown below:

Title page,
Foreign Patent Documents, please change "212704" to -- 0212704 --

Column 1,
Line 4, before new paragraph, please insert as a title -- BACKGROUND OF THE INVENTION --

Column 2,
Line 4, before new paragraph, please insert as a title -- SUMMARY AND OBJECT OF THE INVENTION --
Line 31, before new paragraph, please insert as a title -- BRIEF DESCRIPTION OF THE DRAWINGS --
Line 48, please change "angle" to -- an angle --
Line 54, before new paragraph, please insert as a title -- DETAILED DESCRIPTION OF THE PREFERRED EMBODIMENTS --

Column 3,
Line 27, please change "08/438/198" to -- 08/438,198 --
Line 63, please change "hardcoat 32" to -- hardcoat 36 --

Column 4,
Line 4, please change "hardcoat 32" to -- hardcoat 36 --
Line 10, please change "release layer" to -- release liner --
Line 30, please change "organic hardcoat" to -- organic hardcoat, --
Line 31, please change "hereinbefore described" to -- hereinbefore described, --

UNITED STATES PATENT AND TRADEMARK OFFICE
CERTIFICATE OF CORRECTION

PATENT NO.   : 5,939,189
DATED        : August 17, 1999
INVENTOR(S)  : Roger W. Phillips; Charlotte R. LeGalle It is certified that error appears in the above-identified patent and that said Letters Patent is hereby corrected as shown below:

Column 5,
Line 48, please change "invention, applicant" to -- invention, the applicant --

Column 6,
Line 49, please change "articles, as for" to -- articles, for --

Column 7,
Line 13, please change "and said" to -- and wherein said --

Signed and Sealed this

Fifteenth Day of January, 2002

Attest:

Attesting Officer

JAMES E. ROGAN
*Director of the United States Patent and Trademark Office*